(12) United States Patent
Hung et al.

(10) Patent No.: US 7,023,719 B1
(45) Date of Patent: Apr. 4, 2006

(54) MEMORY MODULE HAVING MIRRORED PLACEMENT OF DRAM INTEGRATED CIRCUITS UPON A FOUR-LAYER PRINTED CIRCUIT BOARD

(75) Inventors: Eric Hung, San Jose, CA (US); Norman Sai, Daly City, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/692,091

(22) Filed: Oct. 23, 2003

(51) Int. Cl.
*G11C 5/06* (2006.01)

(52) U.S. Cl. ............................ 365/63; 365/51; 365/226

(58) Field of Classification Search .................. 365/63, 365/51, 52, 54, 182, 226, 228, 149, 193; 361/794, 764
See application file for complete search history.

(56) References Cited

U.S. PATENT DOCUMENTS

| | | | | |
|---|---|---|---|---|
| 5,260,892 | A | * | 11/1993 | Testa ............................ 365/63 |
| 5,563,773 | A | * | 10/1996 | Katsumata ................... 361/764 |
| 5,719,750 | A | * | 2/1998 | Iwane ......................... 361/794 |
| 5,856,937 | A | * | 1/1999 | Chu et al. ...................... 365/51 |
| 5,945,886 | A | * | 8/1999 | Millar ............................ 333/1 |
| 6,044,032 | A | | 3/2000 | Li |
| 6,154,419 | A | | 11/2000 | Shakkarwar |
| 6,381,164 | B1 | * | 4/2002 | Fan et al. ...................... 365/51 |

(Continued)

FOREIGN PATENT DOCUMENTS

JP   10309030   *   1/2000

OTHER PUBLICATIONS

"Stub Series Terminated Logic for 2.5 Volts (SSTL 2)", JEDEC Standard, JESD8-9B, May 2002.

(Continued)

*Primary Examiner*—Richard Elms
*Assistant Examiner*—Dang Nguyen
(74) *Attorney, Agent, or Firm*—Daffer McDaniel LLP

(57) ABSTRACT

A memory module is provided as well as a method for forming a memory module. The memory module includes a printed circuit board having opposed first and second outside surfaces. At least one via can extend through the printed circuit board and couples a conductor on one outside surface to a conductor on another outside surface. A semiconductor memory device on one of those outside surfaces can thereby be connected to one end of the via, with another semiconductor memory device on the opposing outside surface connected to the other end of the via. Preferably, the pair of memory devices are placed on a portion of each respective outside surface so that they essentially align in mirrored fashion with each other. Accordingly, any vias which extend from the footprint of one memory device will take the shortest path to the footprint of the other memory device, with the stubs between the footprint and the via being of essentially the same length and relatively short. The printed circuit board preferably has no more than four conductive layers dielectrically spaced from each other. Two layers are reserved for the opposing outer surfaces, and two layers carrying power and ground signals are embedded within the board. The memory devices are preferably DDR SDRAMs connected to each other as well as a memory controller, each of are placed and maintained upon a single printed circuit board.

15 Claims, 9 Drawing Sheets

U.S. PATENT DOCUMENTS

| | | |
|---|---|---|
| 6,545,895 B1 | 4/2003 | Li et al. |
| 6,615,326 B1 | 9/2003 | Lin |
| 6,618,320 B1 | 9/2003 | Hasegawa et al. |
| 2003/0048616 A1* | 3/2003 | Ko et al. .................... 361/736 |
| 2003/0107908 A1* | 6/2003 | Jang et al. .................... 365/51 |
| 2003/0137860 A1* | 7/2003 | Khatri et al. ................. 365/63 |
| 2003/0169614 A1* | 9/2003 | Bhakta et al. ................ 365/51 |

OTHER PUBLICATIONS

184 Pin PC 1600/2100 DDR SDRAM Unbuffered DIMM Design Specification, JEDEC Standard, Revision 1.1, Apr. 2003.

"TN-46-05, General DDR SDRAM Functionality", Micron Technology, Jul. 2001.

* cited by examiner

| SDRAM CONTROLLER PIN | M1 TOP PIN | SDRAM CONTROLLER PIN | M1 TOP PIN |
|---|---|---|---|
| SDRAM_A0 | A0 | SDRAM_DQ0 | D0 |
| SDRAM_A1 | A1 | SDRAM_DQ1 | D1 |
| SDRAM_A2 | A2 | SDRAM_DQ2 | D2 |
| SDRAM_A3 | A3 | SDRAM_DQ3 | D3 |
| SDRAM_A4 | A4 | SDRAM_DQ4 | D4 |
| SDRAM_A5 | A5 | SDRAM_DQ5 | D5 |
| SDRAM_A6 | A6 | SDRAM_DQ6 | D6 |
| SDRAM_A7 | A7 | SDRAM_DQ7 | D7 |
| SDRAM_A8 | A8 | SDRAM_DQ8 | D8 |
| SDRAM_A9 | A9 | SDRAM_DQ9 | D9 |
| SDRAM_A10 | A10 | SDRAM_DQ10 | D10 |
| SDRAM_A11 | A11 | SDRAM_DQ11 | D11 |
| SDRAM_A12 | A12 | SDRAM_DQ12 | D12 |
| SDRAM_A13 | A13 | SDRAM_DQ13 | D13 |
| SDRAM_A14 | BA0 | SDRAM_DQ14 | D14 |
| SDRAM_A15 | BA1 | SDRAM_DQ15 | D15 |
| SDRAM_A16 |  | SDRAM_DQM0 | LDM |
| SDRAM_A17 | CS# | SDRAM_DQM1 | UDM |
| SDRAM_CAS_L | CAS# | SDRAM_DQM2 |  |
| SDRAM_RAS_L | RAS# | SDRAM_DQM3 |  |
| SDRAM_CKE | CKE | SDRAM_DQS0 | LDQS |
| SDRAM_WE_L | WE# | SDRAM_DQS1 | UDQS |
| SDRAM_CLK0 |  | SDRAM_DQS2 |  |
| SDRAM_CLK_1 | CLK | SDRAM_DQS3 |  |
| SDRAM_CLK_L0 |  |  |  |
| SDRAM_CLK_L1 | CLK# |  |  |

FIG. 6A

| SDRAM CONTROLLER PIN | M3 TOP PIN | SDRAM CONTROLLER PIN | M3 TOP PIN |
|---|---|---|---|
| SDRAM_A0 | A0 | SDRAM_DQ0 | D0 |
| SDRAM_A1 | A1 | SDRAM_DQ1 | D1 |
| SDRAM_A2 | A2 | SDRAM_DQ2 | D2 |
| SDRAM_A3 | A3 | SDRAM_DQ3 | D3 |
| SDRAM_A4 | A4 | SDRAM_DQ4 | D4 |
| SDRAM_A5 | A5 | SDRAM_DQ5 | D5 |
| SDRAM_A6 | A6 | SDRAM_DQ6 | D6 |
| SDRAM_A7 | A7 | SDRAM_DQ7 | D7 |
| SDRAM_A8 | A8 | SDRAM_DQ8 | D8 |
| SDRAM_A9 | A9 | SDRAM_DQ9 | D9 |
| SDRAM_A10 | A10 | SDRAM_DQ10 | D10 |
| SDRAM_A11 | A11 | SDRAM_DQ11 | D11 |
| SDRAM_A12 | A12 | SDRAM_DQ12 | D12 |
| SDRAM_A13 | A13 | SDRAM_DQ13 | D13 |
| SDRAM_A14 | BA0 | SDRAM_DQ14 | D14 |
| SDRAM_A15 | BA1 | SDRAM_DQ15 | D15 |
| SDRAM_A16 |  | SDRAM_DQM0 |  |
| SDRAM_A17 | CS# | SDRAM_DQM1 |  |
| SDRAM_CAS_L | CAS# | SDRAM_DQM2 | LDM |
| SDRAM_RAS_L | RAS# | SDRAM_DQM3 | UDM |
| SDRAM_CKE | CKE | SDRAM_DQS0 |  |
| SDRAM_WE_L | WE# | SDRAM_DQS1 |  |
| SDRAM_CLK0 | CLK | SDRAM_DQS2 | LDQS |
| SDRAM_CLK_1 |  | SDRAM_DQS3 | UDQS |
| SDRAM_CLK_L0 | CLK# |  |  |
| SDRAM_CLK_L1 |  |  |  |

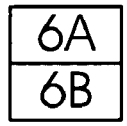

FIG. 6B

| SDRAM CONTROLLER PIN | M2 BOTTOM PIN | SDRAM CONTROLLER PIN | M2 BOTTOM PIN |
|---|---|---|---|
| SDRAM_A0 | A0 | SDRAM_DQ0 | D15 |
| SDRAM_A1 | A1 | SDRAM_DQ1 | D14 |
| SDRAM_A2 | A2 | SDRAM_DQ2 | D13 |
| SDRAM_A3 | A3 | SDRAM_DQ3 | D12 |
| SDRAM_A4 | A4 | SDRAM_DQ4 | D11 |
| SDRAM_A5 | A5 | SDRAM_DQ5 | D10 |
| SDRAM_A6 | A6 | SDRAM_DQ6 | D9 |
| SDRAM_A7 | A7 | SDRAM_DQ7 | D8 |
| SDRAM_A8 | A8 | SDRAM_DQ8 | D7 |
| SDRAM_A9 | A9 | SDRAM_DQ9 | D6 |
| SDRAM_A10 | A10 | SDRAM_DQ10 | D5 |
| SDRAM_A11 | A11 | SDRAM_DQ11 | D4 |
| SDRAM_A12 | A12 | SDRAM_DQ12 | D3 |
| SDRAM_A13 | A13 | SDRAM_DQ13 | D2 |
| SDRAM_A14 | BA0 | SDRAM_DQ14 | D1 |
| SDRAM_A15 | BA1 | SDRAM_DQ15 | D0 |
| SDRAM_A16 | CS# | SDRAM_DQM0 | UDM |
| SDRAM_A17 |  | SDRAM_DQM1 | LDM |
| SDRAM_CAS_L | CAS# | SDRAM_DQM2 |  |
| SDRAM_RAS_L | RAS# | SDRAM_DQM3 |  |
| SDRAM_CKE | CKE | SDRAM_DQS0 | UDQS |
| SDRAM_WE_L | WE# | SDRAM_DQS1 | LDQS |
| SDRAM_CLK0 |  | SDRAM_DQS2 |  |
| SDRAM_CLK_1 | CLK | SDRAM_DQS3 |  |
| SDRAM_CLK_L0 |  |  |  |
| SDRAM_CLK_LI | CLK# |  |  |

FIG. 7A

| SDRAM CONTROLLER PIN | M4 BOTTOM PIN | SDRAM CONTROLLER PIN | M4 BOTTOM PIN |
|---|---|---|---|
| SDRAM_A0 | A0 | SDRAM_DQ0 | D15 |
| SDRAM_A1 | A1 | SDRAM_DQ1 | D14 |
| SDRAM_A2 | A2 | SDRAM_DQ2 | D13 |
| SDRAM_A3 | A3 | SDRAM_DQ3 | D12 |
| SDRAM_A4 | A4 | SDRAM_DQ4 | D11 |
| SDRAM_A5 | A5 | SDRAM_DQ5 | D10 |
| SDRAM_A6 | A6 | SDRAM_DQ6 | D9 |
| SDRAM_A7 | A7 | SDRAM_DQ7 | D8 |
| SDRAM_A8 | A8 | SDRAM_DQ8 | D7 |
| SDRAM_A9 | A9 | SDRAM_DQ9 | D6 |
| SDRAM_A10 | A10 | SDRAM_DQ10 | D5 |
| SDRAM_A11 | A11 | SDRAM_DQ11 | D4 |
| SDRAM_A12 | A12 | SDRAM_DQ12 | D3 |
| SDRAM_A13 | A13 | SDRAM_DQ13 | D2 |
| SDRAM_A14 | BA0 | SDRAM_DQ14 | D1 |
| SDRAM_A15 | BA1 | SDRAM_DQ15 | D0 |
| SDRAM_A16 | CS# | SDRAM_DQM0 | |
| SDRAM_A17 | | SDRAM_DQM1 | |
| SDRAM_CAS_L | CAS# | SDRAM_DQM2 | UDM |
| SDRAM_RAS_L | RAS# | SDRAM_DQM3 | LDM |
| SDRAM_CKE | CKE | SDRAM_DQS0 | |
| SDRAM_WE_L | WE# | SDRAM_DQS1 | |
| SDRAM_CLK0 | CLK | SDRAM_DQS2 | UDQS |
| SDRAM_CLK_1 | | SDRAM_DQS3 | LDQS |
| SDRAM_CLK_L0 | CLK# | | |
| SDRAM_CLK_L1 | | | |

FIG. 7

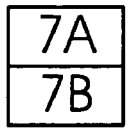

FIG. 7B

MEMORY MODULE HAVING MIRRORED PLACEMENT OF DRAM INTEGRATED CIRCUITS UPON A FOUR-LAYER PRINTED CIRCUIT BOARD

BACKGROUND OF THE INVENTION

1. Field of Invention

This invention relates to semiconductor memory and, more particularly, to packaged semiconductor memory placed in slots that mirror each other on opposing sides of a four layer printed circuit board to optimize the inter-memory and controller-to-memory routing lengths.

2. Description of Related Art

The following descriptions and examples are not admitted to be prior art by virtue of their inclusion within this section.

There are numerous types of memories available in the marketplace. For example, large volumes of data can be stored in magnetic memory, such as a hard disk drive. Lesser quantities of data can be stored in memory arranged upon an integrated circuit, oftentimes referred to as "semiconductor memory." Semiconductor memory is typically arranged closer to the core logic unit or execution unit than the hard disk drive and can be accessed much faster than the disk drive.

Common to semiconductor memory is an array of storage cells. Depending on the function of the semiconductor memory, each storage cell can have a significantly different architecture and function. For example, semiconductor memory can be volatile or non-volatile. Types of volatile memory include memory which must be periodically refreshed (DRAMs) or memory which will lose its programmed state if power is removed (SRAMs).

The differences between SRAMs and DRAMs are fairly significant. For example, each cell of SRAM includes a latch and pass transistors. Conversely, each cell of DRAM involves simply one transistor. While DRAMs are significantly denser than SRAMs, DRAMs require additional support circuitry to coordinate the access of each cell, along with the need to periodically refresh that cell. Since SRAMs typically have faster access times than DRAMs, SRAMs are oftentimes used as the primary cache of the microprocessor or execution unit. DRAMs, on the other hand, are generally used as the main semiconductor memory and are controlled by a memory controller linked to the execution unit typically by a memory bus or system bus. Each transaction between the execution unit and the memory involves a particular bus cycle. Transfers to and from memory are, therefore, synchronized to the clock cycle of the system clock.

There are numerous types of DRAMs, some of which are: fast page mode DRAMs, extended data out DRAMs, burst extended data out DRAMs, and the more recent synchronous DRAMs (SDRAMs). Unlike DRAMs, SDRAMs take advantage of the fact that memory accesses by the execution unit are typically sequential. SDRAMs are designed to fetch all bits within a particular burst in sequential fashion by allowing the column address to be incremented sequentially and in sync with the system clock of the execution unit or processor. This allows an SDRAM one important advantage over other forms of asynchronous DRAMs—data transfer delivery from the SDRAM at burst rates exceeding, for example, 100 MHz.

With the increased access time speed of the SDRAM came yet another enhancement. Instead of providing source-synchronous data capture at the clock frequency, double data rate (DDR) SDRAM allows data to be captured at a rate of twice the system clock frequency. This is accomplished by utilizing a 2n-prefetch architecture, where the internal data bus of the DDR SDRAM is twice the width of the external data bus to allow data capture of twice per system clock cycle. Details of the difference between a single data rate (SDR) SDRAM and DDR SDRAM are set forth in "General DDR SDRAM Functionality," Micron Technology 2001 (herein incorporated by reference).

While both SDR and DDR SDRAM include the same core memory array of cells, the input/output (I/O) interface is considerably different. For example, DDR SDRAM utilizes a differential pair of system clock signals to formulate the triggering rising and falling clock edges, and data strobe signals are needed to drive the data signal to and from the SDRAM memory banks. In addition to its double data rate synchronous operation, SDRAMs can employ memory banks, similar to virtual channels used in DRAM technology. The size of the memory bank can vary and, depending on the overall capacity of the memory module, a memory bank can possibly include an entire semiconductor memory device.

Most modern semiconductor memory units are configured as a memory module, where multiple memory integrated circuits are placed upon a printed circuit board (PCB). An example of a PCB having multiple DRAM or SDRAM semiconductor memory devices is generally known as a single in-line memory module (SIMM) or dual in-line memory module (DIMM). A significantly fast memory module thereby includes multiple SDRAM semiconductor devices (or integrated circuit chips) placed on a PCB or DIMM, with edge connectors that slide into a bus receptacle. Each SDRAM can be operated as a DDR SDRAM and can utilize two or more banks of memory arrays which permit interleaving data between the banks to further reduce access times.

Conventional SIMMs or DIMMs that utilize DDR SDRAMs typically involve placing the SDRAMs semiconductor memory devices on only one surface. At the relatively high speeds at which data is sent to and from each memory device, any mismatch in trace length between, for example, a controller and the memory devices, will deleteriously affect performance of the memory module. Thus, lengthy trace conductors associated with some memory devices and relatively short trace conductors associated with others will degrade the overall performance and access times of the SDRAM—an unfortunate event considering the goal of DDR SDRAM with multiple banks is to increase the access times.

SUMMARY OF THE INVENTION

The problems outlined above are in large part solved by a memory module that can be embedded on the same integrated circuit as the memory controller and the execution unit. Alternatively, the memory module can be configured external to the memory controller or execution unit. An example as an external-configured memory module is one that can plug into a receptacle near the edge of a PCB containing the execution unit and memory controller. An external-configured memory module includes a SIMM or DIMM. The present memory module is designed to utilize more optimal inter-memory and controller-to-memory trace conductor routing lengths. The routing lengths can be shortened and more properly matched in critical address, data, and control paths. A preferred mechanism in which to optimize the routing lengths is by mirroring the semiconductor memory devices on both opposing surfaces of the PCB, regardless of whether the PCB contains the execution unit, or contains receptales to which a SIMM/DIMM is coupled.

Preferably, a first memory device can be placed on a top surface of the PCB, with the outline of that memory device directly above and aligned with a second memory device placed on the bottom surface of the PCB. The first and second memory devices also preferably share the same data bus, address bus, and control bus, with all associated signals. Thus, whatever control, address, or data signals are sent to and from the memory controller, arrive at the top and bottom memory devices at substantially the same time. The only slight difference in time of arrival might be due to the controller being on the top surface sending its signals to the top memory device slightly before sending those signals to the bottom memory device, since the bottom memory device is spaced from the top memory device by a via which is roughly the thickness of the PCB. Thus, instead of having the first and second memory devices on the top surface, arranging the first and second memory devices in alignment with one another on the corresponding top and bottom surfaces provides for substantially the same trace conductor lengths therebetween. This will ensure that signals arrive on those paired memory devices at roughly the same time, which is critical when attempting to achieve the advantages of DDR SDRAMs.

According to one embodiment, a memory module is provided having at least one pair of semiconductor memory devices. A first or primary device can be arranged upon a first outside surface of a PCB, and coupled to a conductor extending across that surface. A second or secondary device can be arranged upon the opposing second outside surface of the PCB. Preferably, the second device is coupled to a conductor on the second outside surface and is directly opposite the first device. Thus, the primary and secondary devices can each comprise a midpoint between outer lateral edges of each respective device. A line or axis can extend through the midpoint of the first device and the midpoint of the second device. That axis will extend also substantially perpendicular to the first and second outside surfaces of the PCB. Stated another way, the first device is placed as a mirror image on a surface of the PCB opposite that of the second device. The outer lateral edges of the first and second devices are, therefore, thought of as being essentially aligned in the horizontal plane if the PCB extends in a horizontal direction. Thus, the first and second devices can be thought of as aligned horizontally with one another, wherein the PCB is arranged between the two devices. Of course, it is noted that the PCB can extend vertically, whereby the first and second devices would then be aligned with each other within the vertical axis.

According to another embodiment, the memory module includes a PCB having no more than four conductive layers. Two of the conductive layers are on the outer opposed surfaces of the PCB, while the remaining two conductive layers are spaced from each other and from the outer surfaces by a dielectric material. All four layers are parallel to one another, with the two inner embedded layers being reserved for power and ground supplies, while the layers on the opposed outer surfaces are reserved for trace conductors that carry command, address, and data signals. Vias extend perpendicular to the planar four layers and through a portion of, if not the entirety of, the PCB. Some vias extend simply from an upper surface to a power or ground conductor, while other vias extend from one upper surface to the opposing upper surface.

According to yet another embodiment, the semiconductor memory devices are preferably SDRAM packaged integrated circuits, with preferably more than one SDRAM on each side of the opposing outside surfaces of the PCB. Each SDRAM can be packaged using thin small outline packaging (TSOP) technology, with leads extending from the package and surface mounted to bonding pads arranged on the corresponding outer surface of the PCB. The bonding pads extend from corresponding trace conductors patterned on those outside surfaces. The PCB is preferably one having a series of edge connectors that form a termination of respective trace conductors. The edge connectors terminate at one end of the PCB and can be extended into receptacles of, for example, a bus backplane. The edge connectors are, therefore, adapted for frictional engagement with and electrical connection to the corresponding bus backplane receptacles.

According to yet another embodiment, a method is provided for arranging memory devices upon a PCB. A pair of packaged memory devices can be arranged on opposing surfaces, with the midpoint of the pair arranged along an axis that extends perpendicular to the opposing outside surfaces of the PCB. A memory controller can also be arranged on one of the opposing outside surfaces. During a single solder reflow step, at least one lead from each one of the pair of memory devices can be surface mounted, as well as at least one lead from the memory controller. For example, the lead from one of the pair of memory devices can be surface mounted to a first end of a via, and also to a first end of a conductor extending across one of the opposing surfaces. The second end of that conductor will, therefore, extend and be connected to a lead of the memory controller. The opposing end of the via will extend to and be connected with a lead of the memory device on the opposing surface of the PCB. Using the above single reflow step, leads of packaged memory devices on opposing surfaces of a PCB can be surface mounted and soldered to conductors that not only extend to other memory devices and a memory controller on the same surface, but also to vias which extend to memory devices on the opposed outside surface. The reflow process of connecting all of the various leads to corresponding conductors and vias takes place during a single solder reflow step.

BRIEF DESCRIPTION OF THE DRAWINGS

Other objects and advantages of the invention will become apparent upon reading the following detailed description and upon reference to the accompanying drawings in which:

FIG. 6 is a table of pin connections between a memory controller and a pair of memory devices placed on an upper (top) surface of the PCB;

FIG. 7 is a table of pin connections between the memory controller and a pair of memory devices placed on a bottom surface of the PCB.

Figure 1:
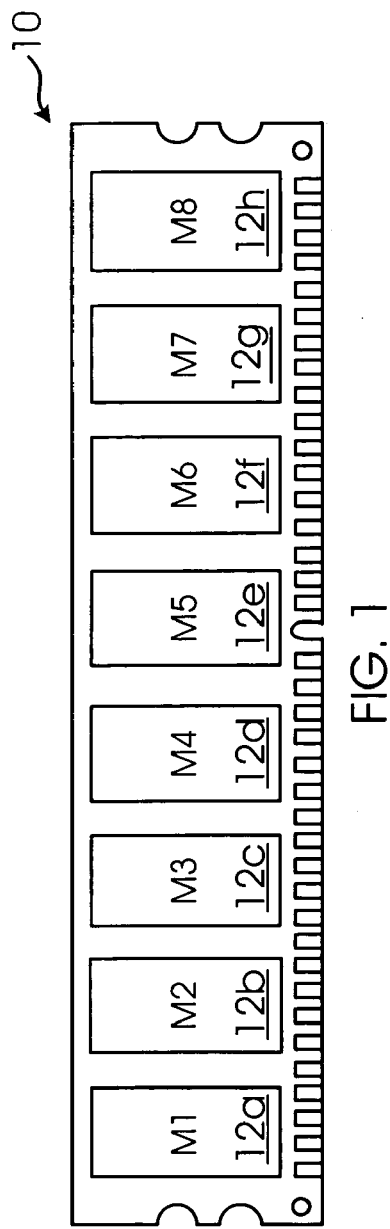
FIG. 1 is a block diagram of semiconductor memory devices arranged in banks or slots upon one surface of a printed circuit board (PCB) to form a memory module, such as an embedded memory module (i.e., on the same PCB as the execution unit) or as a memory module on a separate PCB to form a SIMM or DIMM.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a memory module 10 having a series of semiconductor memory devices 12 placed on one side of module 10. Each semiconductor memory device is defined as being an individual die taken from a semiconductor wafer and hermetically sealed inside a package. The package includes leads that extend from an outer surface of the package, and the leads can thereafter be forwarded through holes or affixed to conductors on the surface of a card or board. There are various types of packages, some of which are through-hole packages and others being surface-mounted packages. Distinguishable from packages which have leads that extend downward into plated holes within a card, surface-mounted packages have leads which extend either flush with the outer surface of the package or outward, flush with a bottom surface of the package. In the latter instance, leads which extend outward are often referred to as a quad flat package (QFP) or a small outline package (SOP).

There are numerous types of packaging technologies available in the marketplace. However, it is preferred that the chosen package be of very low cost and, therefore, thin SOP (i.e., TSOP) can be utilized as the package of choice. Each memory device 12 being a TSOP package can be readily connected through known solder reflow techniques to bond the lower surface of each lead to a corresponding upper surface of a bonding pad arranged on the upper surface of the board in registry with corresponding leads. The bonding pads form one end of a printed conductor. The printed conductor can be formed by, for example, using a photosensitive material to chemically expose and remove various portions of a planar copper layer from the upper surface, leaving a patterned plurality of trace conductors. The upper layer of trace conductors is formed on the board material, preferably made of an epoxy-bonded fiberglass, sometimes referred to as a FR-4 board.

Figure 2:
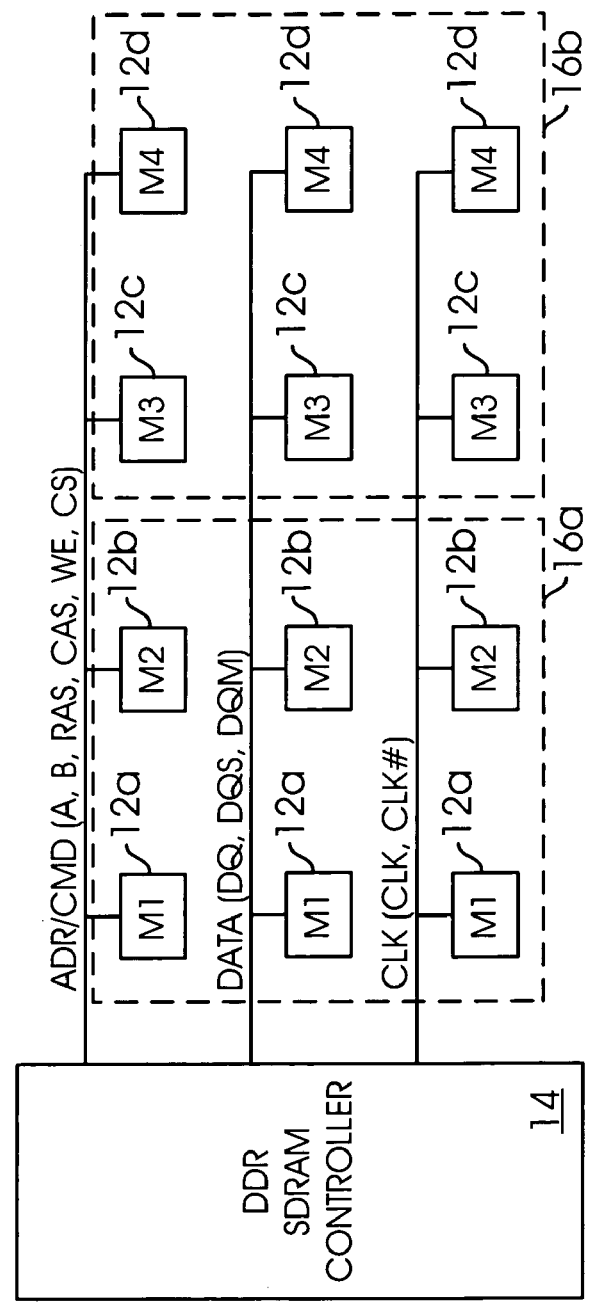
FIG. 2 is a block diagram of a memory module with memory controller placed on one surface of the PCB.

FIG. 2 illustrates semiconductor memory devices 12 in relation to a memory controller 14. For sake of brevity and clarity in the drawing, only four memory devices 12 are shown (M1–4). Preferably, the memory controller is a DDR SDRAM controller if each memory device 12 includes DRAM memory cells and a synchronous I/O interface. FIG. 2 illustrates four memory devices (M1–4) arranged upon only one surface of a board or PCB. In addition to the memory devices 12, memory controller is connected to each memory device via the address, command, data, and clock trace conductors. If memory device 12*a* is closest to controller 14, then the trace length therebetween is the shortest. However, if memory device 12*d* is the furthest from controller 14, then the trace conductor therebetween is the longest. As shown, the address and command signals from controller 14 to the corresponding memory device will travel further distances depending on where each memory device is located on that mutual surface. Similarly, the data and clock signals will also travel differing distances depending upon where the corresponding memory modules (M1–2) are situated.

FIG. 2 illustrates two slots 16*a* and 16*b*, which can be chip selected via a chip select (CS) signal. Thus, slots 16*a*–*b* can be thought of as forming two different banks that can be addressed in an interleaved fashion. The data and clock signals, however, for memory devices 12*a*–*b* can be shared. Thus, the data and clock trace conductors mimic those for the address and command conductors. This concept is better understood when referring to FIG. 4 below.

Figure 3:
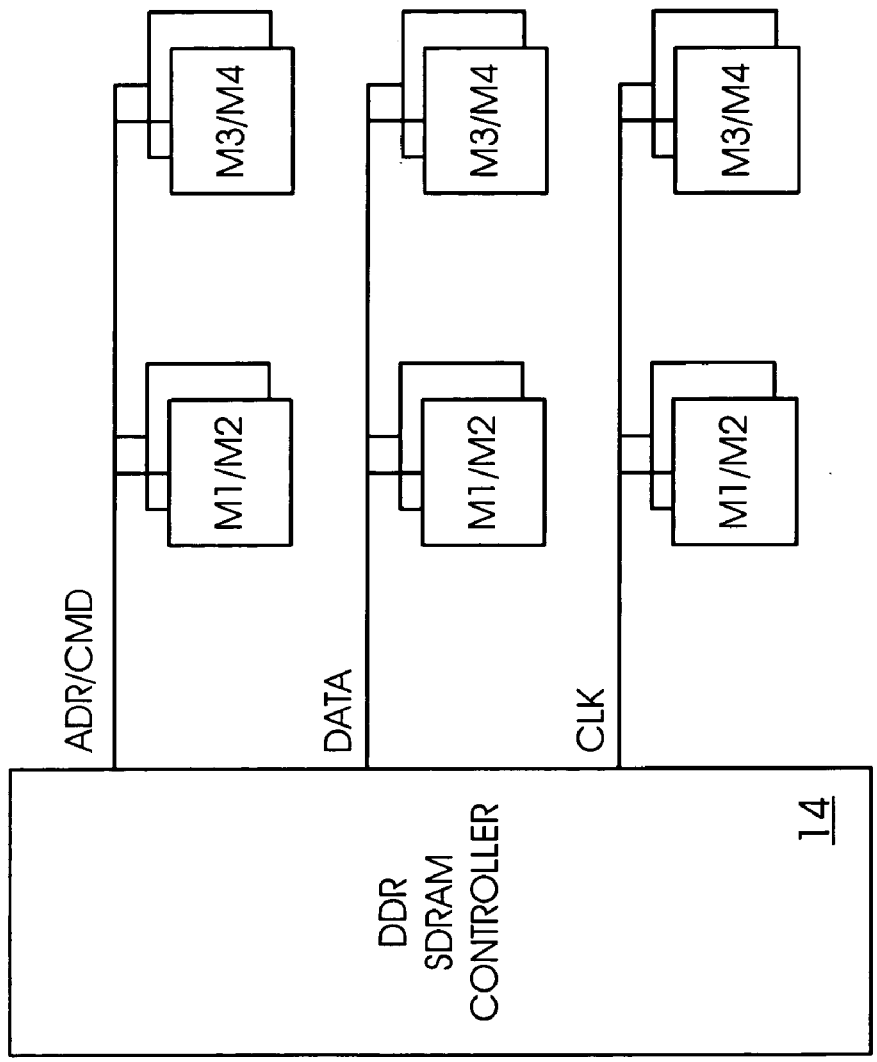
FIG. 3 is a block diagram of a memory module with memory controller placed in mirrored slots on opposing surfaces of the PCB to optimize inter-memory and controller-to-memory routing lengths.

FIG. 3 illustrates an improvement over the substantially long and mismatched trace conductor lengths set forth in FIG. 2. Instead of having to send address and command signals over correspondingly longer trace conductors, beginning at the closest memory device M1 and ending at the longest memory device M4 (as in FIG. 2), FIG. 3 illustrates what would happen if devices M1–2 are placed on opposing surfaces of the PCB, and what would happen if devices M3–4 are also placed on opposing surfaces.

More specifically, FIG. 3 illustrates placing M1 and M2 in mirrored positions and devices M3 and M4 also in mirrored positions. If device M1 is placed directly above device M2 (assuming the PCB is laid flat or in horizontal position), then the additional trace conductor length between upper M1 to lower M2 is roughly equal to the thickness of the PCB. Since the thickness of the PCB is substantially less than the lateral distances between two devices on the same surface, then the additional trace conductor length is almost negligible. The same can be said for mirrored devices M3–4. Any address and command signals sent from controller 14 can thereby arrive at substantially the same time on each of the mirrored pairs. The same can be said for the data and clock signals. Specifically, the memory devices which share a common slot or can be selected together by a chip select (CS) signal are mirrored on opposite surfaces of the PCB, with similar command, data, and clock pins coupled in parallel to memory controller 14.

Figure 4:
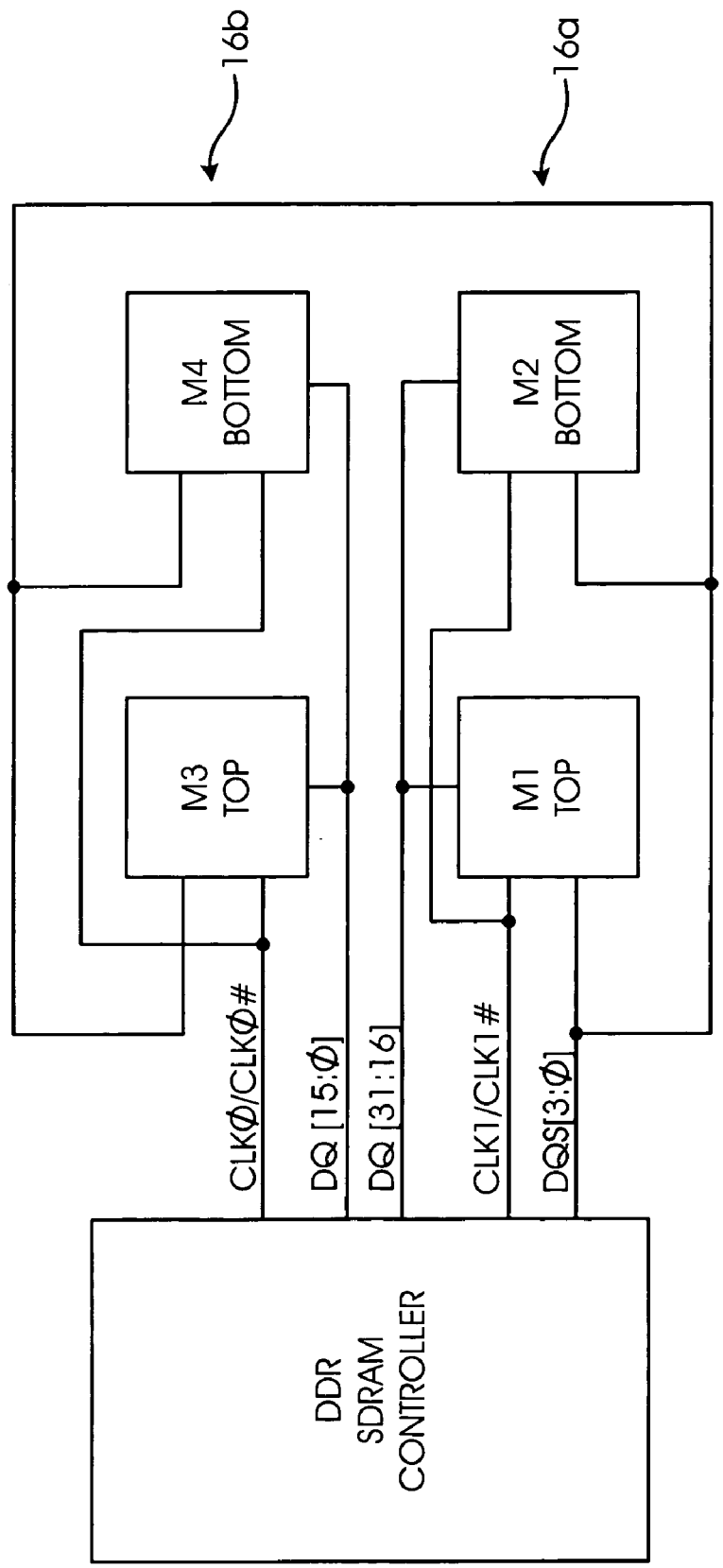
FIG. 4 is a block diagram of the clock, data and data strobe signals for DDR SDRAM memory devices placed on opposing surfaces of the PCB according to FIG. 3.

Referring to FIG. 4, slot 16*a* contains devices M1–2 which are shown to be mirrored on the top and bottom surfaces. Likewise, slot 16*b* contains devices M3–4 also mirrored on the top and bottom surfaces. The various clock signals (CLK) are synchronized to the processor system clock, with the CLK0 and CLK0# being used to form the activate and access times on slot 16*b*. The CLK1 and CLK1# are used to form the activate and access times on slot 16*a*. Likewise, the first 16 trace conductors of the data bus are routed to slot 16*b*, while the second 16 trace conductors of the data bus are sent to slot 16*a*, in the example shown. The true clock and complimentary clock signals provide the differential pair for the DDR memory accesses, with the 32-bit data bus bifurcated to dissimilar banks to form an interleaved access methodology. A data strobe signal (DQS) is used to strobe the data into or from a respective memory device M1–4 depending on the value of the 4-bit field of DQS, as shown.

Although not shown in FIG. 4, the address signals can also include bank address signals from controller 14 to each memory device. The bank address signals can be used to select one of possibly four banks within each memory device M1–4, for example. Thus, a chip select (CS) signal can be sent as part of the command signal to select possibly one pair of memory devices from that of another pair of memory devices, with each pair associated to a corresponding slot. The chip select signal can also be used to select a single memory device from another memory device. A bank address signal can be used to further interleave the SDRAM access.

Figure 5:
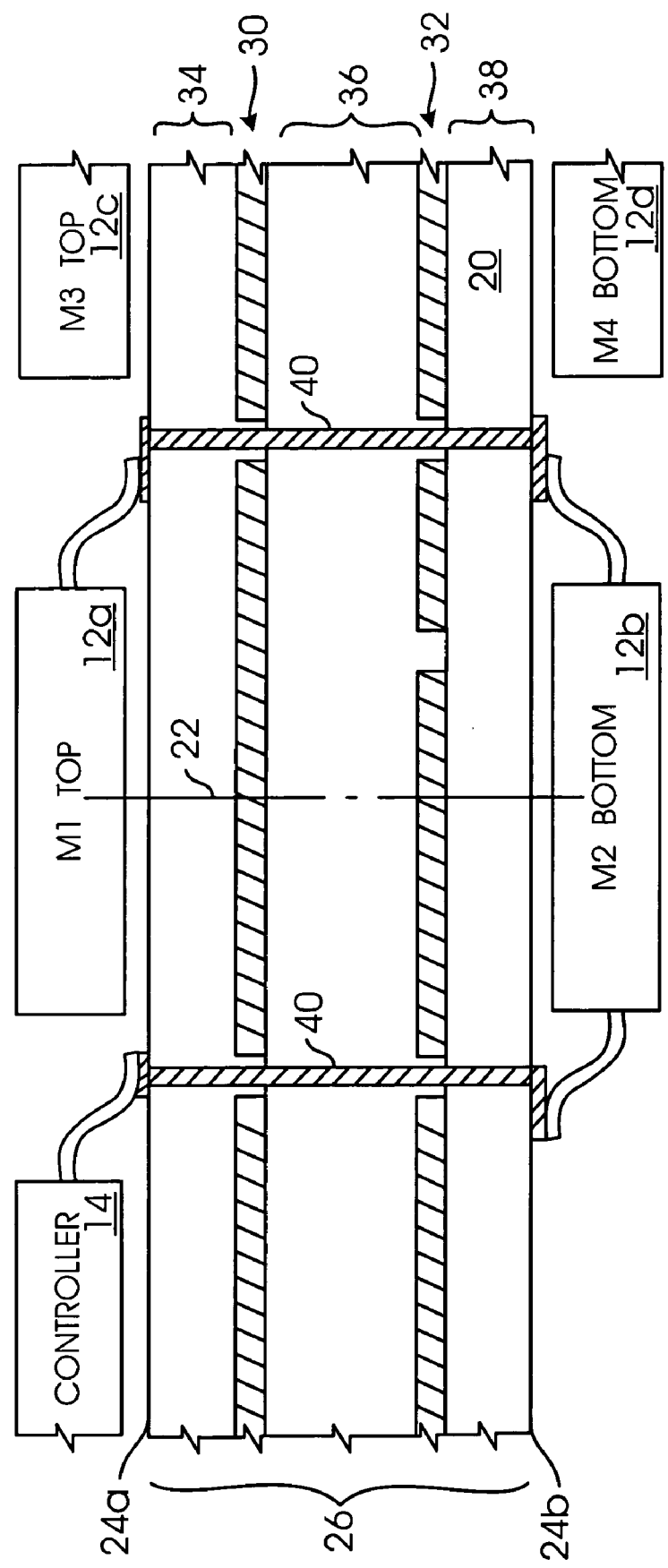
FIG. 5 is a cross-sectional view of a four layer PCB, with leads from small outline package memory devices coupled to trace conductors on opposing surfaces of the PCB.

Referring to FIG. 5, further detail is provided of the mirrored arrangement between memory devices 12 coupled to slots of a PCB 20. As shown, memory devices M1–2 can be aligned such that a midpoint of each device is situated on an axis 22. Preferably, axis 22 extends through the opposed outer surfaces 24a–b at a perpendicular angle. By mirroring devices M1–2, a signal sent from memory controller 14 can be sent to both M1 and M2 with the only trace conductor difference being substantially the thickness 26 of PCB 20. PCB 20 is preferably made of FR-4 material with interspersed copper conductive layers dielectrically spaced from each other within the epoxy-bonded fiberglass, and with a patterned conductive layer on the opposing outer surfaces as well. Thus, PCB 20 consists of no more than four conductive layers dielectrically interspersed parallel to each other. Each memory device M1–4, as shown in the example of FIG. 5, is a packaged integrated circuit preferably packaged as a TSOP device. Likewise, controller 14 can also have a TSOP arrangement.

It is contemplated that the thickness of the trace conductors on the opposing outer surfaces is approximately 0.6 mils. In addition, the thickness of the ground conductive layer 30 is approximately 1.2 mils, and the thickness of the power supply conductive layer 32 is also approximately 1.2 mils. The thickness of the epoxy-bonded fiberglass layers 34 and 38 is approximately 3 mils, whereas the thickness of the epoxy-bonded fiberglass layer 36 is approximately 47 mils. The additional thickness of layer 36 is needed to electrically isolate the power and ground supplies, where power supply 32 preferably includes multiple planar conductors laterally spaced from each other to carry the different power supplies needed to not only power the memory devices M1–4, but also carry the dissimilar power supplies for terminating the ends of the trace conductors at the source and target input/output terminals.

The latter mechanism is indigenous to DDR SDRAM technology involving Stub Series Terminated Logic (SSTL), as will be described in reference to FIG. 8. FIG. 5 illustrates an example of one cross section, where vias 40 are used to connect signals from controller 14 to memory devices, and also to connect signals between memory devices similar to, for example, the data signals sent between the controller and memory devices as well as between memory devices themselves. (See, FIG. 4.)

FIG. 6 illustrates in more detail one exemplary pin-out connection by which the memory controller pins are connected to the top memory devices M1 and M3. FIG. 7, however, shows another example in which the memory controller pins are connected to the bottom memory devices M2 and M4. Referring to both FIGS. 6 and 7, memory controller address pins A0–13 can be connected to both the top and bottom memory devices at corresponding pins A0–13. The bank address BA0–1 on all four memory devices M1–4 is shown connected to address pins A14–15. Because the top memory devices M1 and M3 can be selected for access dissimilar from the bottom memory devices M2 and M4, the chip select (CS#) pin from the top pair of memory devices is connected to a different address pin of the memory controller than that of the bottom pair of memory devices, as shown.

The remaining control signals (CS#, RAS#, CKE, and WE#) share the same controller pins on each of the four memory devices. However, since the memory devices are connected according to the example of FIG. 4, the CLK pins of the memory devices are connected to dissimilar controller pin outputs, either CLK0 or CLK1 as shown. Also as shown in the example, the data pins on the top memory devices can occur in ascending order relative to the memory controller pins, whereas the bottom memory devices form a connection in descending order. This is due to the bottom memory devices being "mirrored" relative to the top memory devices. The data masking pins of the controller are also dissimilar from that of the pair of top memory devices, as well as the bottom memory devices. This allows for upper and lower data bytes to be masked (e.g., allowing M3–4 to transfer DQ[15:0] and M1–2 to transfer DQ[31:16]) as shown in FIG. 4. Correspondingly, the data strobe signals are also shown on different pins for the top memory devices relative one another; likewise, for the bottom memory devices relative to one another.

The pin-out shown in FIGS. 6 and 7 illustrate in more detail the arrangement of address, command, data, and clocking signals carried forward in the example of FIG. 4. It is understood, however, that this is merely an example of possibly numerous ways in which the pins can be connected, and that there certainly can be as few as one memory device on each opposing surface of the PCB or more than one pair on each opposing surface. It is preferred, however, that the present mirrored connection be used in a DDR SDRAM application since maintaining optimal trace conductor lengths is important when achieving the advantages of DDR SDRAM data transfer. DDR SDRAM, more so than convention DRAM or SDR SDRAM technology, relies on high memory bus transfer rates and, therefore, maintaining little if any differential between mirrored memory devices is more critical.

Figure 8:
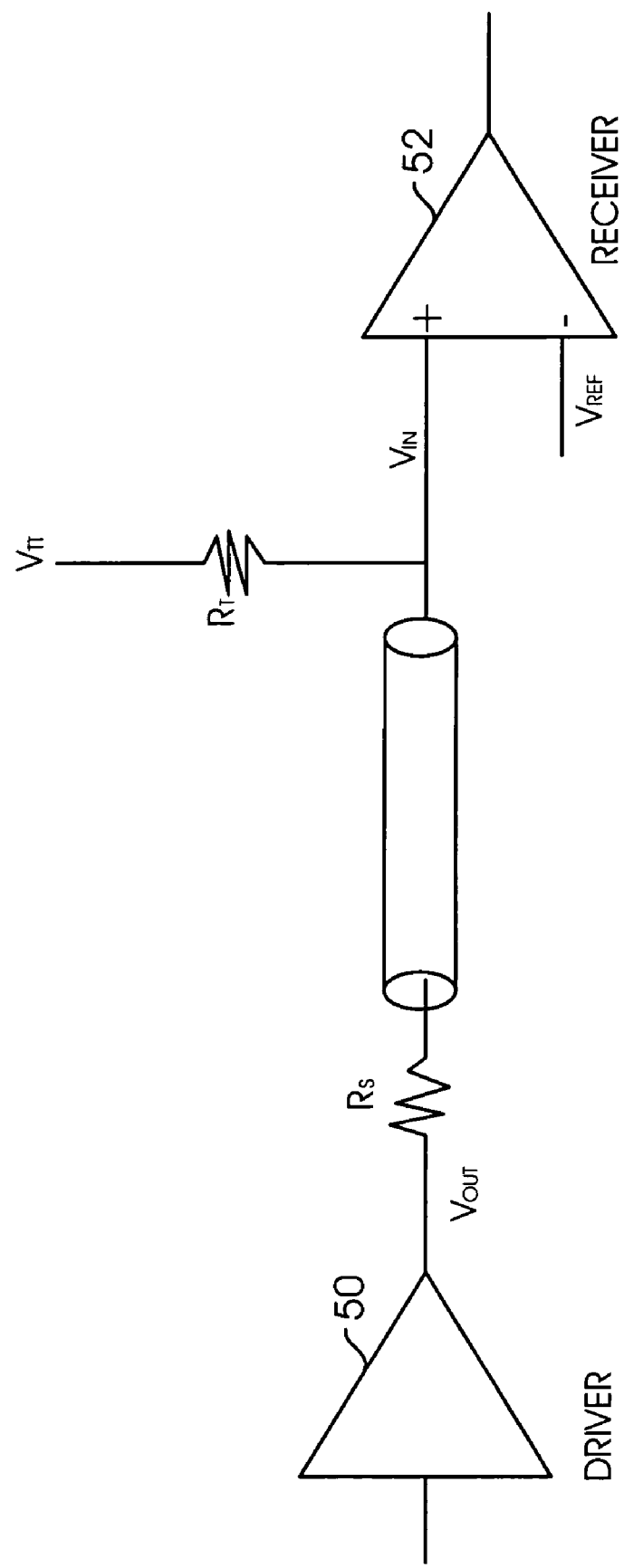
FIG. 8 is a circuit diagram of a driver and receiver combination implemented in SSTL.

FIG. 8 illustrates the preferred mechanism by which each trace conductor between the memory device and controller, as well as between memory devices, is carried out. Specifically, FIG. 8 illustrates SSTL which includes SSTL Versions 1 or 2, oftentimes referred to as SSTL and SSTL_2. At the output of the controller or memory device is a driver 50. The output driver can be achieved by connecting one or a pair of inverters together between a power supply and ground. The output of the inverter is then fed into the trace conductor which has some series resistance ($R_S$). The trace conductor then transfers the corresponding signal to the receiver 52. Indigenous to SSTL technology, a pull-up resistor $R_T$ is used to pull the signal up to termination voltage $V_{TT}$. Preferably, the termination voltage is equal to a reference voltage $V_{REF}$. In some applications, the reference voltage is approximately ½ the device supply voltage $V_{DD}$. The device supply voltage is also used as a supply voltage for the memory devices M1–4.

According to one example, the receiver functions as a comparator that compares the input voltage $V_{IN}$ to the reference voltage $V_{REF}$. If $V_{IN}$ exceeds $V_{REF}$, then an output will be produced according to well-known comparator and differential pair common source amplifier technology. Because of the high speed nature at which signals are transferred in DDR SDRAMs and the use of SSTL termination at each end of the corresponding trace conductors, the mirrored arrangement of SDRAM devices lends credibility to maintaining length (and, therefore, speed) matching of signals sent across critical trace conductor paths. Thus, a signal sent, for example, from a controller to a pair of mirrored memory devices will effectively allow that signal to arrive at each target at approximately the same time with little, if any, amplitude differential that would affect the incoming voltage value $V_{IN}$ relative to the reference voltage. Thus, the present mirrored technology is well-suited to SSTL_2 interfaces.

There are numerous possible modifications and alterations in the structure and method of operation of this invention. Those modifications and alterations will be apparent to those skilled in the art having the benefit of this disclosure. A skilled artisan will recognize that a unique layout arrangement is provided using a mirrored footprint for DDR SDRAM TSOP packages, for example. The PCB used need not have any more than four layers, and that a two-slot configuration can be used in which one slot of the SDRAM is directly placed on the opposing side of the PCB with respect to the other slot. As shown in FIGS. 5–7, memory devices M1 and M3 are placed on the same slot and memory devices M2 and M4 are placed on the same slot. The chip select signal selects devices M1 and M3 separate from the signal selecting devices M2 and M4, due to the CS# being on different output pins of the memory controller pins A16 versus A17.

The resulting PCB not only can be smaller in size, but will accommodate shorter traces for an overall signal integrity improvement. This can lead to increased speed of the overall SDRAM memory module. While DDR SDRAM imposes more stringent and critical timing constraints than other types of memory modules, the mirrored design helps fulfill those constraints with a minimal number of vias and with small stubs between via terminations and the SDRAM bonding pad. The stubs are sufficiently smaller than, for example, 20 mils. The signal ground plane is preferably shared with the main digital ground, and the power supply plane accommodates not only the $V_{DD}$ device supply voltage, but also the reference and termination voltages needed for SSTL logic switching range. Preferably, a four-layer PCB can be achieved approximately 60 mils which is considerably less than conventional routing on one surface between non-mirrored memory devices.

Although the invention has been described in connection with specific preferred embodiments, it should be understood that the invention as claimed should not be unduly limited to such specific embodiments. It is intended that the following claims define the scope of the present invention, and that the structures and methods within the scope of these claims and their equivalents be covered thereby.

What is claimed is:

1. A memory module, comprising:
  a printed circuit board having opposing first and second outside surfaces;
  a unibody via extending along an axis perpendicular to the first and second outside surfaces and extending entirely through the printed circuit board and coupled between a primary conductor on the first outside surface and a secondary conductor on the second outside surface;
  at least one primary semiconductor memory device arranged upon the first outside surface and coupled to the primary conductor;
  a memory controller coupled to the primary conductor;
  at least one secondary semiconductor memory device arranged upon the second outside surface substantially opposite the primary semiconductor memory device and coupled to the secondary conductor; and
  wherein the primary and secondary semiconductor memory devices each comprise a midpoint between outer lateral edges of each respective primary and secondary semiconductor memory device through which a single axis extends substantially perpendicular to the first and second outside surfaces.

2. The memory module as recited in claim 1, wherein the primary and secondary semiconductor memory devices each comprise outer lateral edges that are directly opposite the printed circuit board from each other.

3. The memory module as recited in claim 1, wherein the at least one primary semiconductor memory device comprises a pair of primary semiconductor memory devices arranged on a first portion of the first outside surface, and wherein the at least one secondary semiconductor memory device comprises a pair of secondary semiconductor memory devices arranged on a second portion of the second outside surface substantially opposite the first portion.

4. The memory module as recited in claim 3, wherein a first one of the pair of primary semiconductor memory devices and a first one of the pair of secondary semiconductor memory devices comprise a first central point through which a first axis extends substantially perpendicular to the first and second outside surfaces; and wherein a second one of the pair of primary semiconductor memory devices and a second one of the pair of secondary semiconductor memory devices comprise a second central point through which a second axis extends a parallel, spaced distance from the first axis and substantially perpendicular to the first and second outside surfaces.

5. The memory module as recited in claim 1, wherein the printed circuit board further comprises:
  a power supply conductor arranged upon a power supply plane dielectrically spaced between the first and second outside surfaces; and
  a ground supply conductor arranged upon a ground supply plane dielectrically spaced between the first and second outside surfaces and also between the power supply plane and either the first outside surface or the second outside surface.

6. The memory module as recited in claim 1, wherein the printed circuit board consists of four conductive layers dielectrically separated from each other, and wherein two of the four conductive layers are on the first and second outside surfaces.

7. A memory module, comprising:
  a printed circuit board consisting of four conductive layers dielectrically separated from each other, wherein a first pair of the four conductive layers are on opposed outside surfaces of the printed circuit board and a second pair of the four conductive layers are on dielectrically isolated, parallel inside surfaces of the printed circuit board;
  a plurality of primary conductors arranged on one of the first pair of the four conductive layers;
  a plurality of secondary conductors arranged on another one of the first pair of the four conductive layers;
  a ground supply conductor arranged on one of the second pair of four conductive layers;
  a power supply conductor arranged on another one of the second pair of four conductive layers;
  a primary synchronous dynamic random access memory (SDRAM) packaged integrated circuit coupled to a power supply, and placed in a first slot on a first one of the opposed outside surfaces and coupled to a subset of the plurality of primary conductors;

a secondary synchronous dynamic random access memory (SDRAM) packaged integrated circuit coupled to the power supply, and placed in a second slot on a second one of the opposed outside surfaces and coupled to a subset of the plurality of secondary conductors;

wherein the first and second slots comprise bonding pads arranged on a portion of the respective first and second ones of the opposed outside surfaces to form a footprint in which the primary SDRAM is surface mounted substantially directly opposite the secondary SDRAM;

wherein the plurality of primary and secondary conductors are terminated at each respective end through pull-up resistors and output drivers connected to a reference supply; and wherein the power supply conductor comprises at least two laterally spaced coplanar power supply conductors, and wherein one power supply conductor is coupled between the reference supply and the pull-up resistors and output drivers, and wherein the other power supply conductor is coupled between the power supply and the primary and secondary SDRAMs.

8. The memory module as recited in claim 7, wherein a midpoint between bonding pads which form the footprint on the first one of the opposed outside surfaces is linked by an axial line to the midpoint between bonding pads which form the footprint on the second one of the opposed outside surfaces, and wherein the axis line is perpendicular to the opposed outside surfaces.

9. The memory module as recited in claim 7, wherein the pull-up resistors and output drives comprise termination devices for connecting ends of the plurality of primary and secondary conductors according to stub series terminated logic (SSTL).

10. The memory module as recited in claim 7, further comprising a memory controller placed on only one of the opposed outside surfaces and coupled directly to the plurality of primary conductors and coupled indirectly through vias extending through the printed circuit board to the plurality of secondary conductors.

11. The memory module as recited in claim 7, wherein the primary and secondary SDRAMs are packaged within a thin small outline package (TSOP) with leads extending from the TSOP solder bonded to corresponding bonding pads of the associated first and second slots.

12. The memory module as recited in claim 7 is a single in-line memory module (SIMM), a dual in-line memory module (DIMM), or is arranged on the same printed circuit board as an execution unit or processor.

13. A method for arranging memory devices upon a printed circuit board, comprising:

arranging a pair of packaged memory devices on opposing outside surfaces of the printed circuit board directly opposite one another with the midpoint of the pair arranged upon an axis that extends perpendicular to the opposing outside surfaces;

arranging a memory controller on a first one of the opposing outside surfaces;

in a single step, employing concurrent solder reflow:
surfacing mounting at least one lead extending from a first one of the pair of memory devices to a first end of a via extending perpendicularly through the printed circuit board and to a first end of a conductor extending across a first one of the opposing outside surfaces;

surface mounting at least one lead extending from the memory controller to a second opposed end of the conductor;

surface mounting at least one lead extending from a second one of the pair of memory devices to a second end of the via opposite the first end of the via; and terminating the opposite first and second ends of the conductor with a pull-up resistor to a power supply having a voltage value dissimilar from a voltage value placed on the pair of packaged memory devices.

14. The method as recited in claim 13, further comprising extending the via through an aperture within a power supply planar element and a ground supply planar element dielectrically spaced from each other a dielectrically spaced distance between the opposing outside surface.

15. The method as recited in claim 13, further comprising terminating the opposing first and second ends of the conductor according to stub series terminated logic (SSTL).

* * * * *